(12) United States Patent
Phillips

(10) Patent No.: US 6,307,415 B1
(45) Date of Patent: Oct. 23, 2001

(54) HYSTERESIS CIRCUIT

(75) Inventor: William A. Phillips, Royal Oak, MI (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/566,648

(22) Filed: May 8, 2000

Related U.S. Application Data

(63) Continuation of application No. 08/889,116, filed on Jul. 7, 1997, now Pat. No. 6,127,868, which is a continuation of application No. 08/717,618, filed on Sep. 20, 1996, now abandoned.

(51) Int. Cl.$^7$ ...................................................... H03K 3/12
(52) U.S. Cl. .......................................... 327/205; 327/359
(58) Field of Search ..................................... 327/205, 206, 327/63, 65, 66, 77, 89, 357, 359; 330/252, 253, 257, 260, 261

(56) References Cited

U.S. PATENT DOCUMENTS

| | | | |
|---|---|---|---|
| 4,616,148 | 10/1986 | Ochii et al. ............................. | 327/55 |
| 4,779,016 | 10/1988 | Sugiyama et al. ..................... | 307/475 |
| 4,947,140 | 8/1990 | Tateishi ............................. | 331/113 R |
| 5,268,872 | * 12/1993 | Fujii et al. ............................ | 327/415 |
| 5,276,369 | * 1/1994 | Hayakawa et al. .................... | 327/494 |
| 5,311,150 | 5/1994 | Engbretson et al. ................... | 331/56 |
| 5,446,396 | 8/1995 | Brehmer .................................. | 327/66 |
| 5,495,207 | 2/1996 | Novof ................................... | 331/57 |
| 5,528,185 | * 6/1996 | Lewicki et al. ...................... | 327/206 |
| 6,127,868 | * 10/2000 | Phillips ............................... | 327/205 |

FOREIGN PATENT DOCUMENTS

| | | |
|---|---|---|
| 0 180 084 A2 | 5/1986 | (EP) . |
| 0 577 887 A1 | 1/1994 | (EP) . |

OTHER PUBLICATIONS

Wigmore "More Applications For The 555," *Elektor Electronics*, (No. 164):pp. 24–28, 1989.

Lancaster, "Chapter 4: Multivibrators," *CMOS Cookbook*, 2d ed., Prentice Hall Computer Publishing, pp. 297–304, 1993.

* cited by examiner

*Primary Examiner*—Kenneth B. Wells
(74) *Attorney, Agent, or Firm*—David V. Carlson; Theodore E. Galanthay; Lisa K. Jorgenson

(57) ABSTRACT

The a timer circuit and oscillator are disclosed. The timer circuit is similar in functionality to a '555 timer circuit but uses few transistors. The timer circuit has two differential pairs of transistors, three current mirrors, two selectable current sources, and one inverter. The two differential pairs of transistors, three current mirrors, two selectable current sources, and one inverter are arranged to receive an IN+ voltage, an IN voltage, and a IN– voltage. From these inputs a Q and a Q(bar) output is generated. This timing circuit can be used to generate an oscillator by connecting a capacitor, a current source, and current drain to the IN voltage.

11 Claims, 4 Drawing Sheets

US 6,307,415 B1

HYSTERESIS CIRCUIT

CROSS-REFERENCE TO RELATED APPLICATIONS

This application is a Continuation of U.S. patent application Ser. No. 08/889,116, filed Jul. 7, 1997, now U.S. Pat. No. 6,127,868, which is a continuation of Ser. No. 08/717,618, now abandoned.

BACKGROUND OF THE INVENTION

1. Field of the Invention

This invention relates to electronic circuits used to generate timing signals and more specifically to circuits used to generate a stable and monostable multivibrator such as '555 type timers.

2. Description of the Relevant Art

The problem addressed by this invention is encountered in circuits used for generating astable multivibrators. Astable multivibrators are commonly used, in combination with resistors and a capacitor to generated a square wave type signal. Such a square wave signal is used in many systems including computers, consumer electronic products, and automobiles.

A timer circuit that has a wide rage of astable and monostable possibilities is the low-power CMOS version of the 555 timer, manufactured as either an L555, XR555, or ICM7556. FIG. 1 shows the block diagram of an industry standard L555 as is known in the prior art. The circuit includes a comparator 2, a comparator 4, and a RS flip-flop 6. The RS flip-flop is typically constructed out of two nor gates, also shown in FIG. 1 as nor gates 8 and 10. FIG. 2 shows how the output Q is a function of the IN, IN+, and IN− inputs. These inputs can be controlled to determine the hystersis of the circuit.

FIG. 3 shows in detail the prior art circuit typically used to implement the block diagram of the 555 timer circuit. Transistors 12–28 are configured as a typical comparator which corresponds to comparator 2 of FIG. 1. Similarly, transistors 30–46 correspond to comparator 4 of FIG. 1. Transistors 48–54 correspond to nor gate 8 and transistors 56–62 correspond to nor gate 10, both of FIG. 1. Resistor 64 and transistor 66 are necessary to provide the bias voltage to transistors 24 and 42. FIG. 3 also shows that 27 transistors are needed to use this circuit.

Therefore, it is an objects of the invention to reduce the number of transistors used to make a timer circuit.

It is another object of the invention reduce the cost of a timer circuit by decreasing the number of transistors in the circuit.

It is and yet another object of the invention to increase the reliability of the circuit by decreasing the number of transistors in the circuit.

These and other objects, features, and advantages of the invention will be apparent to those skilled in the art from the following detailed description of the invention, when read with the drawings and appended claims.

SUMMARY OF THE INVENTION

The invention can be summarized as a timer circuit having two differential pairs of transistors, three current mirrors, two selectable current sources, and one inverter. The two differential pairs of transistors, three current mirrors, two selectable current sources, and one inverter are arranged to receive an IN+ voltage, an IN voltage, and a IN− voltage. From these inputs a Q and Q(bar) output is generated. This timing circuit can be used to generate an oscillator by connecting a capacitor, a current source, and current drain to the IN voltage.

DETAILED DESCRIPTION OF THE PREFERRED EMBODIMENT

Figure 1:
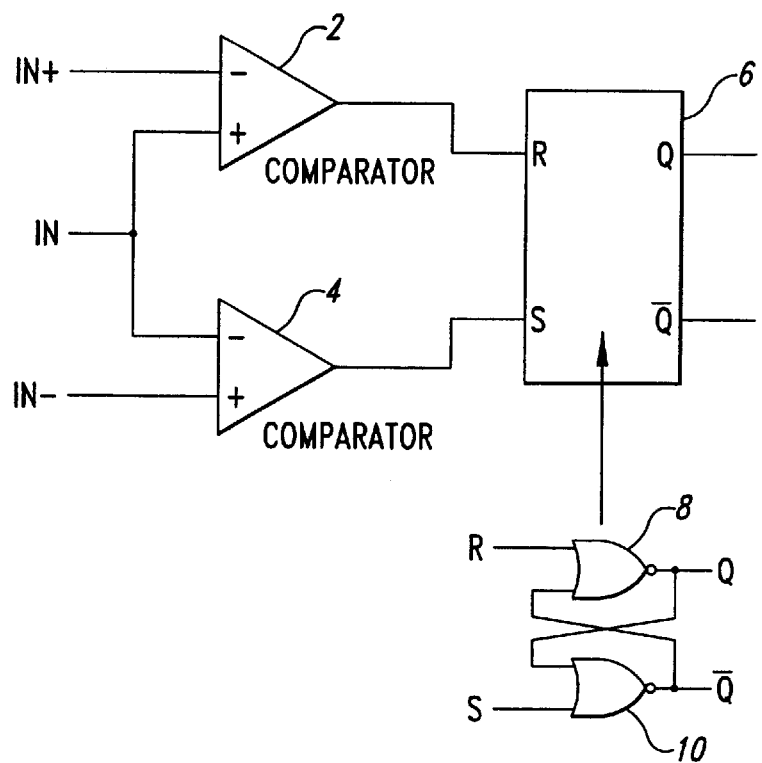
FIG. 1 is a block diagram of a timer circuit as known in the prior art.
Figure 2:
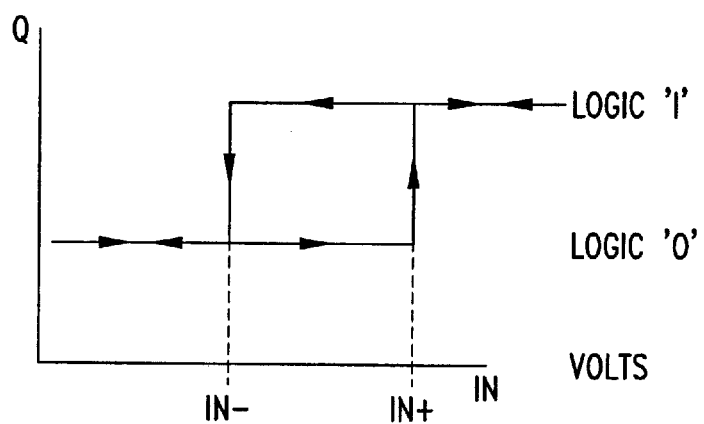
FIG. 2 is a output logic state is input voltage graph for the timer circuit, as known in the prior art.
Figure 3:
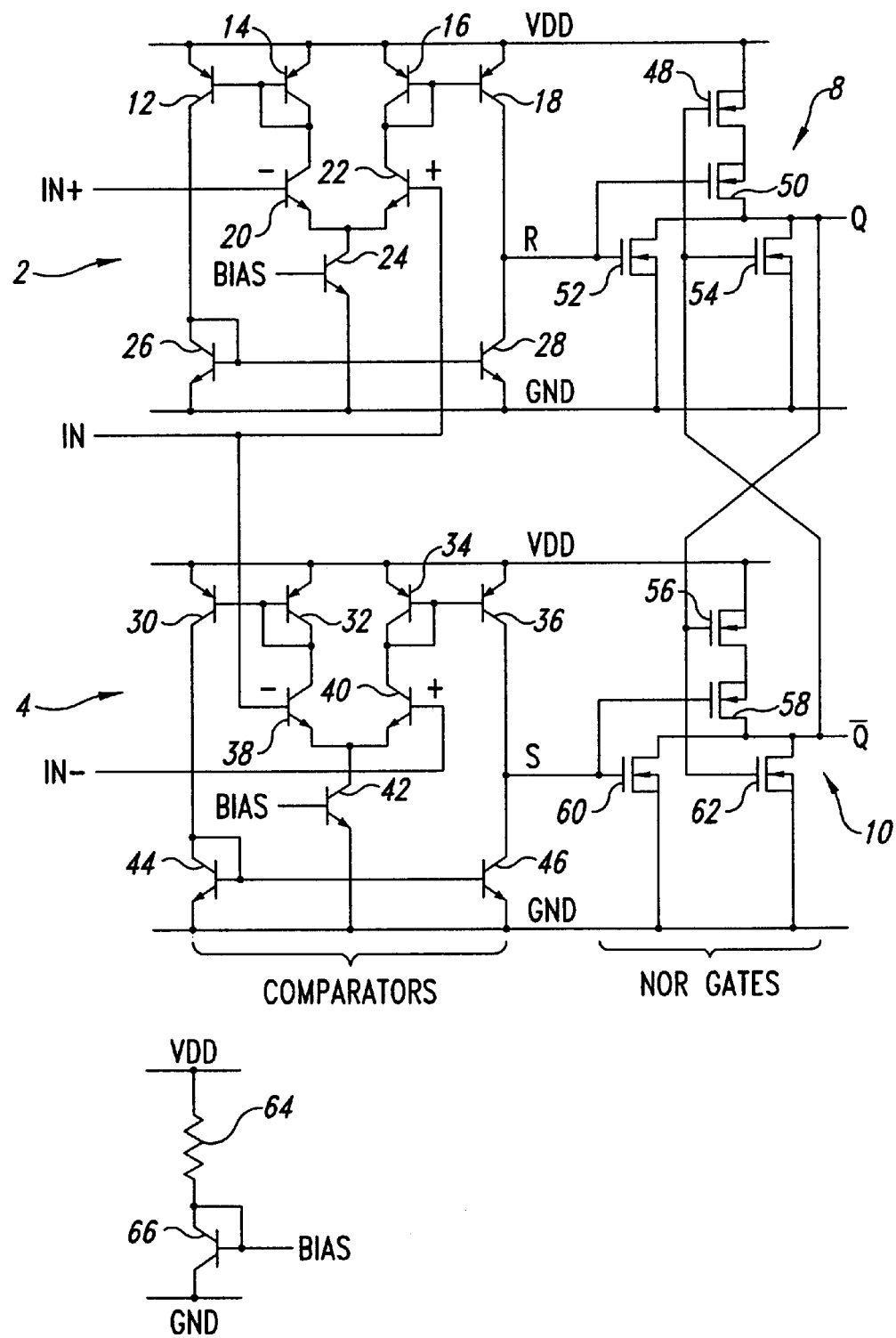
FIG. 3 is a schematic drawing of the timer circuit as known in the prior art.
Figure 4:
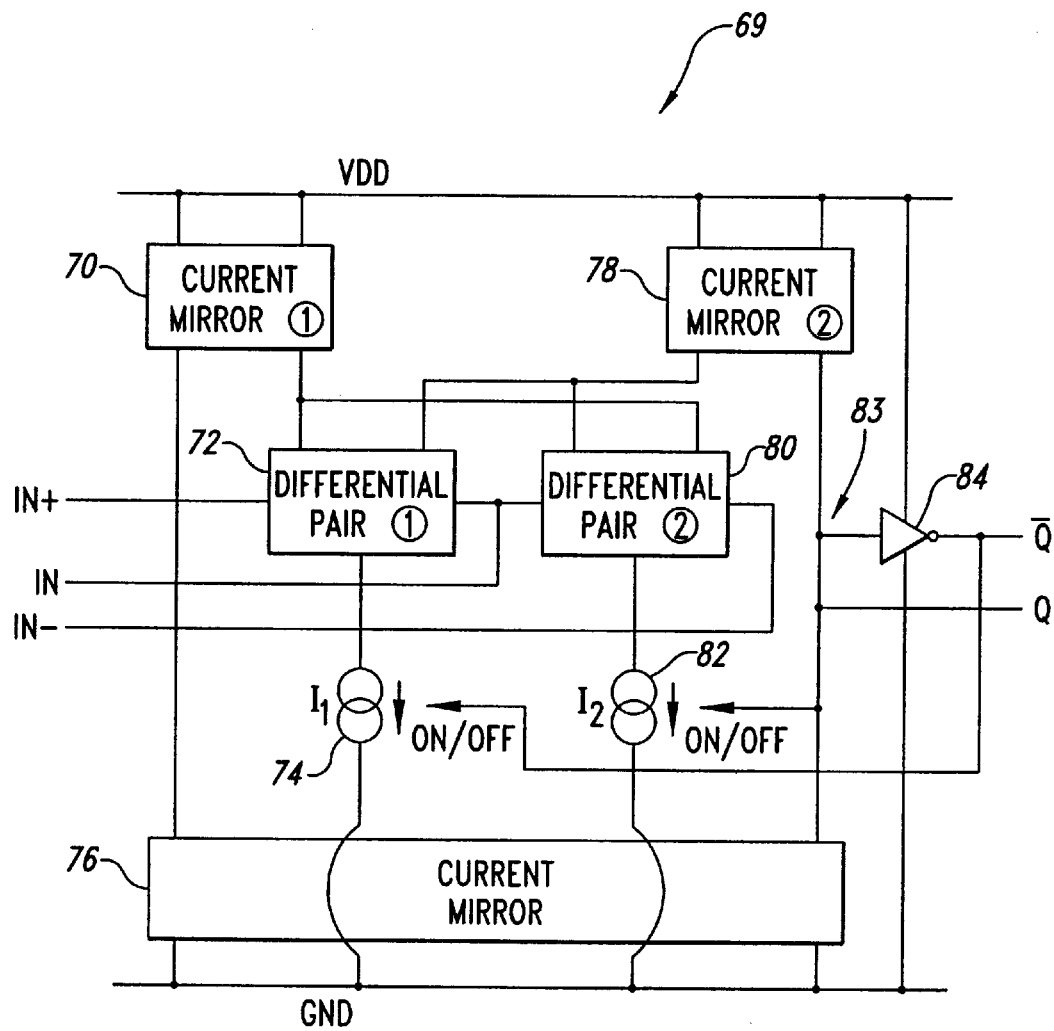
FIG. 4 is a block diagram of a timer circuit, as disclosed.

A timer circuit constructed according to an embodiment of the invention will now be described. FIG. 4 shows a block diagram of the timing circuit. The timing circuit has three inputs for receiving three input voltages; IN+, IN, and IN−. The timing circuit also has two outputs, Q and Q(bar) . The block diagram shows the interconnections between the three current mirrors, 70, 78, and 76, the two differential pair of transistors 72 and 80, the two switchable current sources, 74 and 82, and the one inverter 84.

Current mirrors 70, 76, and 78 have a reference current and a mirrored current. This circuit is constructed by using current mirrors with a 1:1 current ratio between the reference current and the mirrored current. It is understood that this ratio is given as an example and that other ratios can be used by persons skilled if the art.

Figure 5:
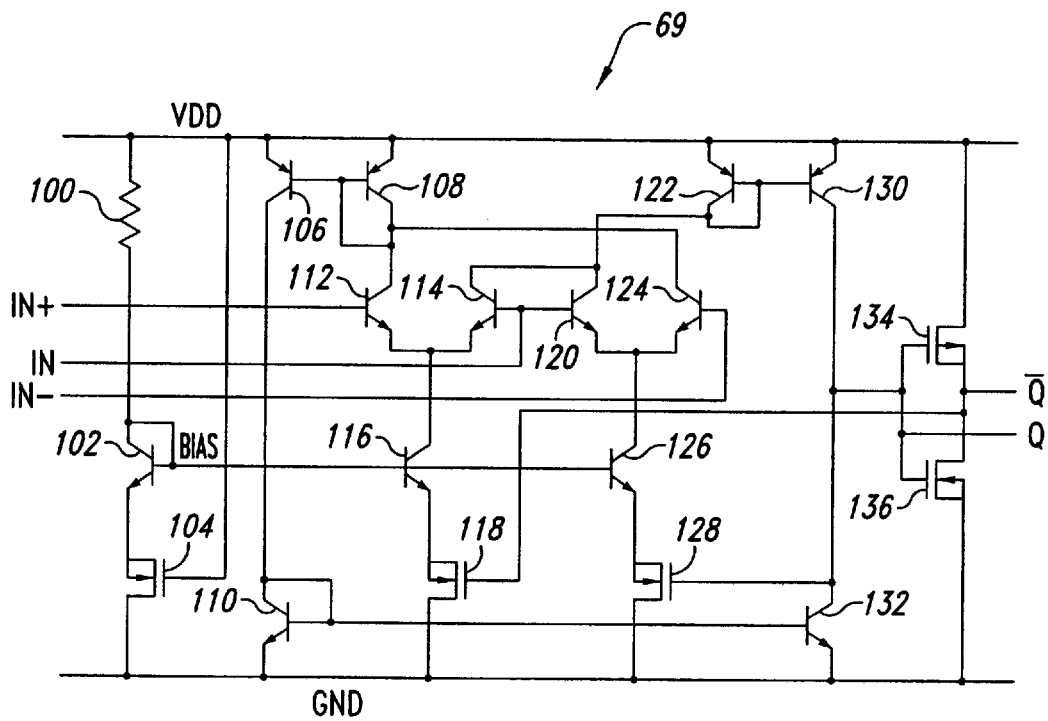
FIG. 5 is a schematic diagram of the timer circuit, as disclosed.

More specifically, the block d agram shows a first current mirror 70 having a mirrored reference current path between Vdd and the third current mirror 76. The reference current path for the first current mirror 70 is between Vdd and the first current path of differential pair 72 and the second current path of differential pair 80. The first and second current paths in a given differential pair correspond to first and second transistors, respectively, as is illustrated in FIG. 5. The second current mirror 78 has a reference current between Vdd and the second current path of the differential pair 72 and the first current path of differential pair 80. The mirrored current path of the second current mirror 78 is between Vdd and the input of inverter 84 and the mirrored current path of the third current mirror 76. This node 83 forms the output, Q, of the timing circuit. A first switchable current source 74 has a current path between the merged current path of the differential pair and ground. The merged current path of a differential pair is the node where the current of the first current path and the second current path meet in a differential pair of transistors. The first switchable current source is controlled by the output of inverter 84. A second switchable current source has current path between the merged current path of differential pair 80 and ground. The second switchable current source 82 has a control element that is connected to node 83 (the output Q of the timing circuit).

In operation, when the IN voltage rises above the IN+ voltage, the second current mirror 78 will have more current than the first current mirror 70. Thus, the output Q will be driven high, turning on switchable current source 82 and turning off switchable current source 74. This latches the new logic state into the circuit. When the input voltage IN falls below IN−, the first current mirror 70 will have more current than the second current mirror 78. Therefore, the Q output will be driven low which turns on the first switchable current source 74 and turns off the second switchable current source 82, hence, latching in the second logic state. In short, persons skilled in the art will recognize that this circuit has the functionality of a typical '555 circuit has been emulated.

The block diagram can be summarized as having two differential pairs, only one of which is active at any given time. Thus, the disclosed circuit compares the voltage IN to IN+ when the output Q is high until IN exceeds IN+. Then, the output Q goes low and voltage IN is compared to IN−. When IN is falls below IN−, the output Q goes high and the cycle is repeated.

FIG. 5 shows a detailed schematic of the timing circuit necessary to implement the block diagram in FIG. 4. First current mirror 70 is implemented with PNP bipolar transistors 106 and 108. The second current mirror 78 is implemented using PNP bipolar transistors 122 and 130. The first differential pair 72 is implemented using NPN bipolar transistors 112 and 114. Similarly the second differential pair 80 is implemented using NPN bipolar transistors 120 and 124. The third current mirror 76 is implemented using NPN bipolar transistors 110 and 132. Inverter 84 is implemented using P-channel MOSFET transistor 134 and N-channel MOSFET transistor 136. Switchable current sources 74 and 82 are configured using transistors 115 and 118, and 126 and 128, respectively.

To construct the timing circuit in FIG. 5, the emitters so transistors 106, 108, 122, and 130 are connected to the supply voltage Vdd. The base of transistor 106 is connected to the base and collector of transistor 108 and to the collector of transistors 112 and 124. The collector of transistor 106 is connected to the collector and base of transistor 110 and the base of transistor 132. The emitters of transistors 110 and 132 are connected to ground. The base of transistor 112 receives the IN+ voltage while the base of transistor 124 receives the IN− voltage. The base of transistors 114 and 120 receive the IN voltage. The base of transistor 130 is connected to the base and collector of transistor 122, and to the collectors of transistors 114 and 120. The collector of transistor 130 is connected to the collector or transistor 132 and the gate of transistor 128 and to the gates of transistors 134 and 136. This node forms the output Q of the timing circuit. The emitters of transistors 112 and 114 are connected together and to the collector of transistor 116. The emitters of transistors 120 and 124 are connected together and to the collector of transistor 126. The bases of transistors 11 and 126 are connected to a bias circuit which is made up of transistors 102 and 104. The emitter of transistor 116 is coupled to the drain of transistor 118. The source o transistor of 118 is coupled to ground. The emitter of transistor 115 is coupled to the drain of transistor 128, the source of resistor 128 is coupled to ground. The gate of transistor 118 is coupled to the output Q[bar] while the gate of transistor 128 is coupled to the Q output.

The inverter 84 is made from transistors 134 and 136. The source of P-channel transistor 134 is connected to Vdd. The drain of transistor 134 is connected to the drain of transistor 136 and forms the Q[bar] output. The source of transistor 136 is connected to ground. The gate of transistor 134 and 136 are connector together and help form the output Q.

Persons skilled in the art will appreciate that this timing circuit has the same functionality of a '555 timing circuit but only uses 19 transistors compared to 27 transistors. By using 3% fewer transistors, the cost of the circuit is decreased while the reliability is increased. Therefore, the disclosed timing circuit is cheaper and more reliable the prior art timers.

Figure 6:
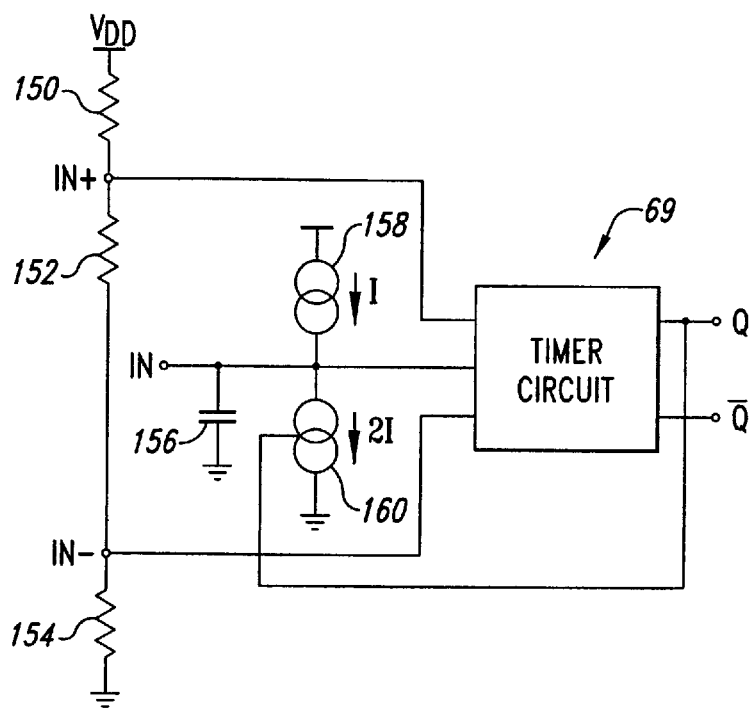
FIG. 6 is a schematic diagram of the timer circuit configured as an oscillator.

FIG. 6 shows timing circuit 69 being used as an oscillator. This oscillator is constructed by connecting resistors 150, 152, and 154 in series between a supply voltage Vdd and ground. Typical values for resistors 150, 152, and 154 are 20 Kohms, 60 Kohms, and 20 Kohms, respectively. This forms a voltage divider circuit which generates a voltage IN+ of about 3.5 volts and IN− of about 1.5 volts, assuming that Vda is about 5 volts. The IN+ and IN− voltages are coupled to the appropriate inputs of the timing circuit 69. The IN voltage input is connected to the first plate or capacitor 156, which can be around 10 nanofarads. The second plate is connected to ground. The first plate of capacitor 156 is also connected to a current source 158 and a current drain 160. FIG. 6 shows current source 158 as being half the current capacity of current drain 160. It will be understood by persons skilled in the art that this ratio is arbitrary and that any ratio will work as long as the current drain capability of current drain 160 is larger than the current source capability of current source 158. Current source 158 is shown as a fixed current source or constant current source while current drain 160 is shown as being controllable by the output Q.

In operation, when the output Q is high, charge is being depleted from capacitor 156 by current drain 160 and therefore the voltage IN is going down at a rate proportional to the current drain 160 and the capacitance of capacitor 156. When the voltage IN falls below the voltage set up by the voltage divider IN−, then the timer circuit will switch states which turns off current drain 160. Therefore, current source 158 can charge up capacitor 156 thereby raising the voltage on the IN voltage input. When the IN voltage exceeds the IN+ voltage the timer circuit will again change states. By repeating this cycle the output of this oscillator is a square wave oscillating at a frequency proportional to the current sourcing and draining capability of current source 158 and current drain 160, respectively, and the capacitance of capacitor 156.

Although the invention as been described and illustrated with a certain degree of particularity, it is understood that the present disclosure has been made only by way of example, and than numerous changes in the combination and arrangement of parts can be resorted to by those skilled in the art without departing from the spirit and scope of the invention, as hereinafter claimed.

I claim:

1. A hysteresis circuit, comprising:

first and second differential pairs, each having a first current path with a control element, a second current path with a control element, and a merged current path with a control element, the merged current path coupled to a ground voltage;

a first current mirror having a reference path and a mirrored path, the reference path coupled from a supply voltage line to the first current path of the first differential pair, and coupled to the second current path of the second differential pair;

a second current mirror having a reference path and a mirrored path, the reference path coupled from the supply voltage line to the second current path of the first differential pair, and coupled to the first current path of the second differential pair;

measuring circuitry for measuring the current flowing through the first current mirror and the second current mirror, the measuring circuitry having a first output connected to the control element of the merged path of the first differential pair and having a second output connected to the control element of the merged path of the second differential pair; and wherein the measuring circuitry outputs alternately enable the control elements of the first and second differential pairs so that one or the other has current flowing through it.

2. The hysteresis circuit of claim 1 wherein the measuring circuit comprises:

a third current mirror having a reference path and a mirrored path, the reference path coupled between the mirrored path of the first current mirror and the ground voltage; and a voltage sensing node connected to the mirrored path of the second current mirror and the mirrored path of the third current mirror.

3. The hysteresis circuit of claim 2, further comprising:

a first control line connecting the voltage sensing node to the control element of the merged current path of the second differential pair;

a complement generator for accepting the first control line as an input and providing a complement to the first control line as an output; and a second control line connecting the output of the complement generator to the control element of the merged current path of the first differential pair.

4. The hysteresis circuit of claim 3 wherein the complement generator is made of one P-type transistor and one N-type transistor.

5. The hysteresis circuit of claim 1 wherein the control element of the merged current path in each differential pair is an MOS transistor.

6. The hysteresis circuit of claim 1, further comprising:

a first reference node coupled to the control element of the second current path of the first differential pair, the first reference node for receiving a first reference signal;

a second reference node coupled to the control element of the first current path of the second differential pair, the second reference node for receiving a second reference signal;

a testing node coupled to the control element of the second current path of the first differential pair and coupled to the control element of the first current path of the second differential pair, the testing node for receiving a testing signal;

wherein when the testing signal is greater than the first reference signal, a signal on the first control line controls the control element of the merged current path of one of the differential pairs to stop current flow through that differential pair; and wherein when the testing signal is less than the second reference signal, a signal on the second control line controls the control element of the merged current path of the other differential pair to stop current flow through that differential pair.

7. A hysteresis circuit comprising:

first and second differential pairs, each having a first current path with a control element, a second current path with a control element, and a merged current path with a control element, the merged path coupled to a ground voltage;

a first current mirror having a reference path and a mirrored path, the reference path coupled from a supply voltage line to the first current path of the first differential pair, and coupled to the second current path of the second differential pair;

a second current mirror having a reference path and a mirrored path, the reference path coupled from the supply voltage line to the second current path of the first differential pair, and coupled to the first current path of the second differential pair;

measuring circuitry for measuring the current flowing through the first current mirror and the second current mirror, the measuring circuitry having a first output connected to the control element of the merged path of the first differential pair and having a second output connected to the control element of the merged path of the second differential pair, the measuring circuit comprising a third current mirror having a reference path and a mirrored path, the reference path coupled between the mirrored path of the first current mirror and the ground voltage and a voltage sensing node connected to the mirrored path of the second current mirror and the mirrored path of the third current mirror; and wherein the measuring circuitry outputs alternately enable the control elements of the first and second differential pairs so that one or the other has current flowing through it.

8. The hysteresis circuit of claim 7, further comprising:

a first control line connecting the voltage sensing node to the control element of the merged current path of the second differential pair;

a complement generator for accepting the first control line as an input and providing a complement to the first control line as an output; and a second control line connecting the output of the complement generator to the control element of the merged current path of the first differential pair.

9. The hysteresis circuit of claim 8, wherein the complement generator is made of one P-type transistor and one N-type transistor.

10. The circuit of claim 7, wherein the control element of the merged current path in each differential pair is a MOS transistor.

11. A hysteresis circuit comprising:

first and second differential pairs, each having a first current path with a control element, a second current path with a control element, and a merged current path with a control element, the merged path coupled to a ground voltage;

a first current mirror having a reference path and a mirrored path, the reference path coupled from a supply voltage line to the first current path of the first differential pair, and coupled to the second current path of the second differential pair;

a second current mirror having a reference path and a mirrored path, the reference path coupled from the supply voltage line to the second current path of the first differential pair, and coupled to the first current path of the second differential pair;

measuring circuitry for measuring the current flowing through the first current mirror and the second current mirror, the measuring circuitry having a first output connected to the control element of the merged path of the first differential pair and having a second output connected to the control element of the merged path of the second differential pair;

wherein the measuring circuitry outputs alternately enable the control elements of the first and second differential pairs so that one or the other has current flowing through it;

a first reference node coupled to the control element of the second current path of the first differential pair, the first reference node for receiving a first reference signal;

a second reference node coupled to the control element of the first current path of the second differential pair, the second reference node for receiving a second reference signal;

a testing node coupled to the control element of the second current path of the first differential pair and coupled to the control element of the first current path of the second differential pair, the testing node for receiving a testing signal;

wherein when the testing signal is greater than the first reference signal, a signal on the first control line controls the control element of the merged current path of one of the differential pairs to stop current flow through that differential pair; and wherein when the testing signal is less than the second reference signal, a signal on the second control line controls the second element of the merged current path of the other differential pair to stop current flow through that differential pair.

* * * * *